United States Patent [19]

Bogan et al.

[11] Patent Number: 4,710,429
[45] Date of Patent: Dec. 1, 1987

[54] LAMINATES FROM EPOXIDIZED PHENOL-HYDROCARBON ADDUCTS

[75] Inventors: Gary W. Bogan, Lake Jackson, Tex.; Peter A. Lucas, Allentown, Pa.; Georgia A. Monnerat; Dale J. Aldrich, both of Lake Jackson, Tex.

[73] Assignee: The Dow Chemical Company, Midland, Mich.

[21] Appl. No.: 4,986

[22] Filed: Jan. 20, 1987

Related U.S. Application Data

[63] Continuation-in-part of Ser. No. 827,989, Feb. 7, 1986, abandoned, which is a continuation-in-part of Ser. No. 723,392, Apr. 15, 1985, abandoned.

[51] Int. Cl.$^4$ .................. C08G 59/04; C08G 59/32
[52] U.S. Cl. .................. 428/417; 428/285; 428/901; 525/523; 528/97; 528/98; 528/106
[58] Field of Search .................. 528/97, 98; 525/523; 528/106; 428/417, 285

[56] References Cited

U.S. PATENT DOCUMENTS

| | | | |
|---|---|---|---|
| 3,264,358 | 8/1966 | Webb et al. | 528/97 X |
| 3,384,617 | 5/1968 | Casale et al. | 528/97 |
| 3,419,624 | 12/1968 | Cotter | 528/97 X |
| 3,536,734 | 10/1970 | Vegter et al. | 260/348.6 |
| 4,167,542 | 9/1979 | Nelson | 525/445 |
| 4,211,715 | 7/1980 | Kanagawa et al. | 528/97 X |
| 4,390,680 | 6/1983 | Nelson | 528/97 |
| 4,394,497 | 7/1983 | Nelson et al. | 528/101 |

OTHER PUBLICATIONS

Article in a Japanese trade newspaper, The Kagaku Kogyo Daily, Mar. 23, 1985, entitled "Electronics Related Materials Entered the Second Stage/Dipp Epoxy, Originally Developed Material, Reached the Goal".

*Primary Examiner*—Earl Nielsen

[57] ABSTRACT

Laminates are prepared for reinforced expoxy resin compositions comprising (A) a reinforcing material such as fiberglass, (B) one or more epoxy resins such as a hydrocarbon-phenol eposy resin and (C) one or more epoxy resin curing agents such as a hydrocarbon-phenol resin or phenol-formaldehyde novolac resin. These laminates are particularly suitable for use in electrical applications such as the manufacture of printed circuit boards.

12 Claims, No Drawings

LAMINATES FROM EPOXIDIZED PHENOL-HYDROCARBON ADDUCTS

CROSS REFERENCE TO RELATED APPLICATION

This is a continuation-in-part of copending application Serial No. 827,989 filed Feb. 7, 1986, now abandoned, which is a continuation-in-part of copending application Serial No. 723,392 filed Apr. 15, 1985 (now abandoned).

BACKGROUND OF THE INVENTION

The present invention pertains to laminates, particularly electrical laminates.

Laminates have previously been prepared from bisphenol A based epoxy resins. It is known that the properties of a laminate can be improved by employing multifunctional epoxy novolac resins in the formulations. It is also known that just as significant as the improvements in laminate properties is the detrimental effect that multifunctional epoxy resins have on processability. The tris(hydroxyphenyl)methane, tetra(hydroxyphenyl)ethane and phenol-formaldehyde epoxy novolac resins have been unsuccessful toward this end because to achieve a glass transition temperature (Tg) of 150° C. or higher, when cured with dicyandiamide, requires sufficient quantities of the multifunctional epoxy resin to have adverse effects in the following areas: (1) varnish reactivity, (2) prepreg reactivity, (3) prepreg cosmetics, (4) reinforcement wetability, (5) laminate pressing, (6) laminate post cure requirement and (7) blister resistance of the laminate.

It has now been discovered that these deficiencies can be overcome by the use of hydrocarbonphenol epoxy resins. They not only provide the electrical laminates prepared therefrom an improvement in electrical and moisture resistance properties, but they also provide an improvement in one or more of the above enumerated deficiencies.

SUMMARY OF THE INVENTION

The present invention concerns an improvement in laminates which have a Tg of at least 150° C. prepared from a cured composition comprising
(A) at least one reinforcing material;
(B) at least one epoxy resin; and
(C) at least one curing agent for component (B);
wherein the improvement resides in employing as at least a part of component (B), at least one hydrocarbon-phenol epoxy resin or halogenated hydrocarbon-phenol epoxy resin in an amount such that at least about 40, preferably from about 90 to about 100 percent of the epoxy groups present in component (B) are contributed by said hydrocarbon-phenol epoxy resin or halogenated hydrocarbon-phenol epoxy resin.

DETAILED DESCRIPTION OF THE INVENTION

Suitable hydrocarbon-phenol epoxy resins which can be employed herein include those disclosed by Vegter et al in U.S. Pat. No. 3,536,734, by Nelson in U.S. Pat. No. 4,390,680 and Nelson et al in U.S. Pat. No. 4,394,497 all of which are incorporated herein by reference. Particularly suitable hydrocarbon-phenol epoxy resins include those prepared by dehydrohalogenating the reaction product of an epihalohydrin and the reaction product of an aromatic hydroxyl-containing compound with an unsaturated hydrocarbon having from about 4 to about 55 carbon atoms. Suitable aromatic hydroxyl-containing compounds which can be employed herein include any such compounds which contain one or two aromatic rings, at least one phenolic hydroxyl group and at least one ortho or para ring position with respect to a hydroxyl group available for alkylation.

Particularly suitable aromatic hydroxyl-containing compounds which can be employed herein include, for example, phenol, chlorophenol, bromophenol, methylphenol, hydroquinone, catechol, resorcinol, guaiacol, pyrogallol, phloroglucinol, isopropylphenol, ethylphenol, propylphenol, t-butylphenol, isobutylphenol, octylphenol, nonylphenol, cumylphenol, p-phenylphenol, o-phenylphenol, m-phenylphenol, bisphenol A, dihydroxydiphenyl sulfone, mixtures thereof and the like.

Suitable unsaturated hydrocarbons which, either in a crude or purified state, can be employed herein include, for example, butadiene, isoprene, piperylene, cyclopentadiene, cyclopentene, 2-methylbutene-2, cyclohexene, cyclohexadiene, methyl cyclopentadiene, dicyclopentadiene, limonene, dipentene, linear and cyclic dimers of piperylene, methyl dicyclopentadiene, dimethyl dicyclopentadiene, norbornene, norbornadiene, ethylidine norbornene, mixtures thereof and the like. Also suitable unsaturated hydrocarbons include the other dimers, codimers, oligomers and cooligomers of the aforementioned unsaturated hydrocarbons. Particularly suitable unsaturated hydrocarbons which can be employed herein include, for example, a dicyclopentadiene concentrate containing from about 70 to about 100 percent by weight of dicyclopentadiene; from about 0 to about 30 percent by weight of $C_8$–$C_{12}$ dimers or codimers of $C_4$–$C_6$ dienes such as, for example, cyclopentadieneisoprene, cyclopentadienepiperylene, cyclopentadienemethyl cyclopentadiene, and/or dimers of isoprene, piperylene, methyl cyclopentadiene and the like; from about zero to about 7 percent by weight of $C_{12}$–$C_{18}$ trimers of $C_4$–$C_6$ dienes and from about zero to about 10 percent by weight of aliphatic diolefins such as, for example, piperylene, isoprene, 1,5-hexadiene and cyclic olefins such as cyclopentadiene, methyl cyclopentadiene, cyclopentene and the like. Methods of preparation for these dicyclopentadiene concentrates and more detailed descriptions thereof can be found collectively in U.S. Pat. No. 3,557,239 issued to Gebhart et al and U.S. Pat. No. 4,167,542 issued to Nelson, both of which are incorporated herein by reference.

Also, particularly suitable unsaturated hydrocarbons which can be employed herein include a crude dicyclopentadiene stream containing from about 20 to about 70 percent by weight dicyclopentadiene, from about 1 to about 10 percent codimers and dimers of $C_4$–$C_6$ hydrocarbons (described above), from about zero to about 10 percent oligomers of $C_4$–$C_6$ dienes and the balance to provide 100 percent, $C_4$–$C_6$ alkanes, alkenes and dienes.

Also, particularly suitable unsaturated hydrocarbons which can be employed herein include a crude piperylene or isoprene stream containing from about 30 to about 70 percent by weight piperylene or isoprene, about zero to about ten percent by weight $C_8$–$C_{12}$ dimers and codimers of $C_4$–$C_6$ dienes, and the balance to provide 100% $C_4$–$C_6$ alkanes, alkenes and dienes.

Also, particularly suitable are hydrocarbon oligomers prepared by polymerization of the reactive components in the above hydrocarbon streams e.g., dicyclopentadiene concentrate, crude dicyclopentadiene, crude piperylene or isoprene, individually or in combination with one another or in combination with high purity diene streams.

These hydrocarbon-phenol epoxy resins can be employed alone or in admixture with other epoxy resins such as the diglycidyl ethers of dihydric phenols such as, for example, resorcinol, catechol, hydroquinone, bisphenol A, bisphenol F, dihydroxybiphenyl, mixtures thereof and the like. Also suitable are the polyglycidyl ethers of phenolic materials having more than two hydroxyl groups such as, for example, tris(hydroxyphenyl)methane, tetra(hydroxyphenyl)ethane, phenol-aldehyde novolacs, mixtures thereof and the like. Also, suitable are the halogenated derivatives, particularly the brominated derivatives of the aforementioned epoxy resins.

Suitable curing agents which can be employed herein include, for example, amines, acids or anhydrides thereof, biguanides, imidazoles, ureaaldehyde resins, melamine-aldehyde resins, phenolics, halogenated phenolics, combinations thereof and the like. These and other curing agents are disclosed in Lee and Neville's *Handbook of Epoxy Resins*, McGraw-Hill Book Co., 1967 which is incorporated herein by reference. Particularly suitable curing agents include, for example, dicyandiamide, diaminodiphenylsulfone, 2-methylimidazole, diethylenetoluenediamine, bisphenol A, tetrabromobisphenol A, phenol-formaldehyde novolac resins, halogenated phenolformaldehyde resins, hydrocarbon-phenol resins combinations thereof and the like.

Suitable reinforcing materials which can be employed herein include, for example, fiberglass, aromatic polyamides, aramid resins, carbon, graphite, quartz, synthetic fibers, combinations thereof and the like. The reinforcing materials can be woven, matt, filament or in the form of random fibers.

Suitable catalysts or promoters or accelerators which can be employed in the preparation of the prepreg materials from which the laminates are prepared include, for example, tertiary amines, imidazoles, phosphonium compounds, ammonium compounds, sulfonium compounds, mixtures thereof and the like.

Suitable tertiary amines include, for example, triethylenediamine, N-methylmorpholine, triethylamine, tributylamine, benzyldimethylamine, tris(dimethylaminomethyl)phenol, mixtures thereof and the like.

Suitable imidazoles include, for example, 2-methylimidazole, 1-propylimidazole, mixtures thereof and the like.

Suitable phosphonium compounds include, for example, those disclosed by Dante et al in U.S. Pat. No. 3,477,990, Perry in Canadian Pat. No. 893,191 and U.S. Pat. No. 3,948,855 and by Tyler, Jr. et al in U.S. Pat. No. 4,366,295 all of which are incorporated herein by reference.

Suitable quaternary ammonium compounds include, for example, benzyl trimethyl ammonium chloride, benzyl trimethyl ammonium hydroxide, tetrabutyl ammonium chloride, tetrabutyl ammonium hydroxide, mixtures thereof and the like.

Suitable solvents which can be employed to prepare the electrical laminates include, for example, glycol ethers, ketones, aromatic hydrocarbons, alcohols, amides, combinations thereof and the like. Particularly suitable solvents include, for example, methyl ethyl ketone, acetone, methanol, dimethylformamide, ethylene glycol methyl ether, propylene glycol methyl ether, combinations thereof and the like.

The laminates of the present invention are suitable for use in electrical applications, structural laminates or composites and the like. They are particularly suitable for use in the manufacture of printed circuit boards.

The printed circuit boards, of course, have an outer layer of an electrical conductive material such as copper, gold, silver, platinum and the like.

The following examples are illustrative of the invention, but are not to be construed as to limiting the scope thereof in any manner.

Epoxy Resin A is a phenol-formaldehyde epoxy novolac resin having an average functionality of about 3.8 and an epoxide equivalent weight, EEW, of 200.

Epoxy Resin B is a glycidyl ether of tris(hydroxyphenyl)methane novolac (the reaction product of hydroxybenzaldehyde with phenol in a molar ratio of 1 to 4 respectively) having an average functionality of about 5.9 and an epoxide equivalent weight, EEW, of 218.

Epoxy Resin C is the glycidyl ether of the reaction product of phenol and a dicyclopentadiene concentrate consisting of about 83% DCPD, 1.4% non-reactive light hydrocarbons, and the remainder being primarily a mixture of codimers of $C_4$–$C_6$ dienes. This resin has an average functionality of about 3.2 and an epoxide equivalent weight, EEW, of 279.

In the Example and Comparative Experiments, the resin varnish was prepared from the indicated formulation in the following manner.

The indicated amount of epoxy resin solution was blended with the indicated amount of dicyandiamide solution. 2-Methylimidazole was added, if necessary, to adjust the varnish reactivity to approximately 200 seconds by stroke cure gel time. Additional acetone was added, if necessary, to bring the overall varnish viscosity to 21 seconds by a #2 Zahn cup.

The tests were performed according to the following procedures. The relative blister resistance was determined by placing three 2"×4" (76.2 mm×101.6 mm) unclad laminate coupons in a pressure pot at 15 psi (713 kPa) steam for 60 minutes (3600 s) and 120 minutes (7200 s). After this time the coupons were removed, externally dried and dipped in molten solder at 500° F. (260° C.) for 20 seconds. Each side of the 3 coupons was then inspected for any delamination blisters. The results were reported as the percent of number of sides with no blisters. Degrees of cure were measured by glass transition temperatures and/or exotherms as evidenced on a DuPont 1090 Thermal Analyzer with a 910 Differential Scanning Calorimeter (DSC). All gel times were measured by stroke cure on a 171° C. hot plate.

The resin flow is a measure of the amount of resin that will be expelled during a pressing operation. The % flow is measured by the following procedure:
1. cut six 6"×6" (152.4 mm×152.4 mm) squares of prepreg;
2. stack the 6 pieces and weigh to the nearest ±.01 gram;
3. put the stack between caul plates and place into a preheated press at 340° F. (171.1° C.) and apply a pressure of 200 psi (1379 kPa);
4 leave in the press for at least 10 minutes;
5. remove the pressed laminate and cut into a 4"×4" (101.6 mm×101.6 mm) piece;
6. weigh the 4"×4" (101.6 mm×101.6 mm) piece to the nearest ±.01 gram; and 7. the following calculation is used to determine % flow:

$$\% \text{ flow} = \frac{\text{initial weight}/2 - \text{final weight}}{\text{initial weight}/2}$$

COMPARATIVE EXPERIMENT A

A. Formulation

A varnish was prepared employing the aforementioned procedure employing the following formulation.

4292 grams (18.241 equiv.) of an 85% by weight solution of Epoxy Resin A in methyl ethyl ketone.

2287 grams (10.95 equiv.) of a 10% by weight solution of dicyandiamide in a 50/50 by weight solvent blend of dimethylformamide and propylene glycol methyl ether.

500 grams of acetone to adjust solution viscosity.

B. Preparation of Preimpregnated Substrate

Burlington style 7628 glass cloth with an I-617 finish was impregnated with the above varnish formulation. The impregnation was done in a forced air vertical treater having a total length of 36 feet (10,972.8 mm). The first 27 feet (8,229.6 mm) were heated to 350° F. (176.7° C.). The last 9 feet (2,743.2 mm) were not heated. The treater was operated at rates of 11, 13, 15 and 17 feet per minute (55.88, 66.04, 76.2 and 86.36 mm/s). The resultant preimpregnated glass cloth had a gel time of 124 seconds except for the one prepared at 11 ft./min. (55.88 mm/s) which gelled (0 gel time). The resin content of the impregnated glass cloth was 37% by weight.

C. Preparation of Laminate

A single opening Wabash press was preheated to 350° F. (176.7° C.). Eight plys of 12"×12" (304.8 mm×304.8 mm) preimpregnated glass cloth prepared in (B) above was placed between 2 steel plates and Teflon pads. The above lay-up was placed into the press and a minimal amount of pressure, 30 psig (206.844 kPa) was applied to help control the laminate thickness and resin flow. At 5 minutes (300 s), the pressure was increased gradually to 500 psig (3447.4 kPa).

The results were as follows: (1) The varnish gel time was 124 seconds. This is considerably faster than the typical 200 second gel time especially since there was no accelerator (2-methylimidazole) added. (2) The prepreg cosmetics (uniformity of resin coating on the glass) was in all instances very poor. The surface was very rough and mottled. (3) The impregnation of the glass (wetability) was very poor. If properly wet out, the prepreg should be translucent. In this instance, the prepreg was virtually opaque. (4) The excessive resin flow during lamination, even with an initial low pressure period, caused resin starved areas in the laminate. (5) The very rapid build in viscosity as evidenced by the dynamic mechanical spectroscopy (DMS) curves caused considerable air entrapment in the laminate. (6) During the typical 1 hour (3600 s), 500 psig (3447.4 kPa) press cycle at 350° F. (176.7° C.) the laminate did not reach full cure. Even after a post bake cycle of 16 hours (57,600 s) at 175° C., the laminate was still not fully cured. (7) A blister resistance test of 60 and 120 minutes (3600 and 7200 s) exposure to 15 psig (103.422 kPa) steam followed by immersion in 500° F. (260° C.) solder for 20 seconds was conducted and at 60 min. (3600 s), 50% of the samples passed and at 120 min. (7200 s), none of the samples passed. (8) The dielectric constant was 5.64 and the dissipation factor was 0.0080.

COMPARATIVE EXPERIMENT B

A. Preparation of Varnish

A varnish was prepared employing the procedure in part A of Comparative Experiment A employing the following formulation.

4301 grams (13.81 equiv.) of a 70% by weight solution of Epoxy Resin B in methyl ethyl ketone.

1740 grams (8.9 equiv.) of a 10% by weight solution of dicyandiamide in a 50/50 by weight solvent blend of dimethylformamide and propylene glycol methyl ether.

No acetone was added, as no viscosity adjustment was required.

B. Preparation of Preimpregnated Substrate

The same glass cloth, vertical treater and treater conditions were employed in this experiment as in part B of Comparative Experiment A. The treater was operated at 16 feet per minute (81.28 mm/s). The resultant preimpregnated glass cloth had a gel time of 92 seconds. The resin content was 41% by weight.

C. Preparation of Laminate

The same press conditions and press cycle were employed in this experiment as in part C of Comparative Experiment A. The results were as follows: (1) The gel time of the varnish from which the laminate was prepared was 147 seconds. This is considerably faster than the typical 200 second gel time, especially since there was no accelerator (2-methylimidazole) present. (2) The prepreg cosmetics were very poor. The surface was very rough and mottled. (3) The wet-out of the glass cloth was very poor. The prepreg was virtually opaque. (4) The excessive resin flow even during the low pressure cycle caused resin starved areas. (5) The rapid build in viscosity near the gel point (similar to that of Comparative Experiment A) as evidence by the DMS curves caused considerable air entrapment in the laminate. (6) During the typical 1 hour (3600 s), 500 psig (3447.4 kPa), press cycle at 350° F. (176.7° C.), the laminate did not reach full cure as evidenced by an exotherm at 205° C. during DSC analysis. Even after a 16 hour (57,600 s) post cure at 175° C., the laminate exothermed at 220° C. again indicating an incomplete cure. (7) A blister resistance test of 60 and 120 minutes (3600 and 7200 s) exposure to 15 psig (103.422 kPa) steam followed by immersion in 500° F. (260° C.) solder for 20 seconds was conducted and at 60 min. (3600 s), 100% of the samples passed and at 120 min. (7200 s), none of the samples passed.

EXAMPLE I

A. Preparation of Varnish

A varnish was prepared employing the procedure part A of Comparative Experiment A employing the following formulation.

4939 grams (14.15 equiv.) of an 80% by weight solution of Epoxy Resin C in acetone.

1782 grams (8.49 equiv.) of a 10% by weight solution of dicyandiamide in a 50/50 by weight solvent blend of dimethylformamide and propylene glycol methyl ether.

2.77 grams of 2-methylimidazole to adjust the reactivity.

400 grams of acetone were added to adjust the solution viscosity.

B. Preparation of Preimpregnated Substrate

The same glass cloth, vertical treater and treater conditions were employed in this experiment as in part B of Comparative Experiment A. The treater was operated at 8.5 feet per minute (43.18 mm/s). The resultant preimpregnated glass cloth had a gel time of 150 seconds. The resin content was 40% by weight.

C. Preparation of Laminate

The same press conditions and press cycle were employed in this example as in part C of Comparative Experiment A. The results were as follows: (1) The varnish formulation was accelerated with 2-imidazole to obtain the typical 200 second gel time. (2) The prepreg cosmetics were excellent. The surface was very smooth and even. (3) The wetability of the glass cloth was very good. The prepreg was translucent which is indicative of good wet-out. (4) There were no resin starved areas on the laminate even though the prepreg had a longer gel time than that of Comparative Experiment A. (5) There was no air entrapped in the laminate. (6) Full cure of the laminate was achieved in the 1 hour (3600 s) press cycle. The glass transition temperature (Tg) was 185° C. as determined by DSC, differential scanning calorimetry. Following a 16 hour (57,600 s) post cure at 175° C., there was no significant increase in the Tg indicating that full cure is achieved in the 1 hour (3600 s) press cycle. (7) A blister resistance test of 60 and 120 minutes (3600 and 7200 s) exposure to 15 psig (103.422 kPa) steam followed by immersion in 500° F. (260° C.) solder for 20 seconds was conducted and at 60 min. (3600 s), 83% of the samples passed and at 120 min. (7200 s), 83% of the samples passed. (8) The dielectric constant was 4.75 and the dissipation factor was 0.00696.

The results of Comparative Experiments A and B and Example 1 are tabulated in the following table.

|  | Comparative Experiments A | Comparative Experiments B | Example 1 |
| --- | --- | --- | --- |
| Varnish Reactivity, seconds | 124 | 147 | 200 |
| Prepreg Reactivity, seconds | 124 | 92 | 150 |
| Prepreg Appearance | Poor | Poor | Excellent |
| Glass Wetability | Poor | Poor | Excellent |
| Resin Flow, % | 60 | 50 | 25 |
| Blister Resistance (120 min.) % Sides with no blisters | 0 | 0 | 83 |
| Dielectric Constant @ 1 KHZ | 5.64 | 5.25 | 4.75 |
| *Residual Exotherm (after 16 hours @ 175° C. | Yes | Yes | No |
| **Amount of 2-methylimidazole required for reactivity adjustment | 0 | 0 | 2.77 |

*Residual exotherm is an indication that the reaction mixture was not totally cured, i.e. a reaction was still taking place.
**Amount of 2-methylimidazole required to adjust the reactivity so that the gel time of the reaction mixture was approximately 200 seconds.

EXAMPLE 2

A. Preparation of Varnish

A varnish was prepared employing the procedure of Comparative Experiment A, Part A from the following components.

124 grams (0.46 epoxy equiv.) of Epoxy Resin C.
44 grams (0.16 phenolic hydroxyl equiv.) of tetrabromobisphenol A.
62 grams (0.35 phenolic hydroxyl equiv.) of a novolac resin prepared by reacting phenol with a mixture consisting of about 83% dicyclopentadiene, 1.4% non-reactive light hydrocarbons and the remainder being primarily a mixture of codimers of $C_4$–$C_6$ dienes. This resin had an average functionality of about 3.2 and a phenolic hydroxyl equivalent weight of about 176.9.
0.35 grams of 2-methyl imidazole.
92 grams of acetone.
31 grams of propylene glycol methyl ether.

B. Preparation of Preimpregnated Substrate

Strips of 6 in. (152.4 mm) wide 7628 style fiberglass cloth were dipped into the above solution and dried in a forced draft oven at 350° F. (176.6° C.) for 90 sec. The resultant preimpregnated substrate material contained 41.8% resin, 58.2% glass and had a gel time of 131 seconds at 345° C.

C. Preparation of Laminate

Eight layers of the above preimpregnated substrate material were pressed in an electrically heated press under the following conditions, each step being sequential:

80° F.(26.7° C.) to 290° F. (143.3° C.) at 12° F./min (0.1157° C./sec.) at 35 psig (241.3 kPa).
290° F.(143.3° C.) to 350° F. (176.7° C.) at 12° F./min (0.1157° C./sec.) and the pressure increased to 450 psig (3102.7 kPa) at a rate of 140 psig/min (16.09 kPa/sec).
maintained at 350° F. (176.7° C.) and 450 psig (3102.7 kPa) for 90 min (5400 sec).
cooled from 350° F. (176.7° C.) to 150° F. (65.6° C.) at −20° F./min (-0.185° C./sec). and a pressure of 450 psig (3102.7 kPa).

The press was then opened and the laminate removed. The laminate had the following properties.
Glass transition temp. (heated at 20° C./min) . . . 167° C.
Thickness . . . 58 mils (0.147 mm)Resin
Flow . . . 8%
Uniformly translucent over entire area. Dielectric constant at 100 KHz . . . 4.5

EXAMPLE 3

A. Preparation of Varnish

A varnish was prepared employing the procedure of Compartive Experiment A, Part A employing the following components.

121 grams (0.45 epoxy equiv.) of Epoxy Resin C.
50.6 grams (0.19 phenolic hydroxyl equiv.) of tetrabromobisphenol A.
24.5 grams (0.22 phenolic hydroxyl equiv.) of phenol-formaldehyde novolac resin having an average functionality of about 5 and a phenolic hydroxyl equivalent weight of about 110.
0.3 grams of 2-methyl imidazole.
112 grams of acetone.
2.5 grams of propylene glycol methyl ether.

B. Preparation of Preimpregnated Substrate

Strips of 6 in. (152.4 mm) wide 7628 style fiberglass cloth were dipped into the above solution and dried in a forced draft oven at 350° F. (176.6° C.) for 90 sec. The resultant preimpregnated substrate material contained 42.4% resin, 57.6% glass and had a gel time of 107 seconds at 345° C.

C. Preparation of Laminate

Eight layers of the above preimpregnated substrate material were pressed in an electrically heated press under the following conditions, each step being sequential:

80° F.(26.7° C.) to 275° F. (135° C.) at 12° F./min (0.1157° C./sec.) at 35 psig (241.3 kPa).

275° F.(135° C.) to 350° F. (176.7° C.) at 12° F./min (0.1157° C./sec.) and the pressure increased to 350 psig (2413.2 kPa) at a rate of 160 psig/min (18.39 kPa/sec). maintained at 350° F. (176.7° C.) and 350 psig (2413.2 kPa) for 90 min (5400 sec).

350° F. (176.7° C.) to 150° F. (65.6° C.) at −20° F./min (−0.185° C./sec). and a pressure of 350 psig ((2413.2 kPa).

The press was then opened and the laminate removed. The laminate had the following properties.
Glass transition temp. (heated at 20° C./min) ... 175° C.
Thickness ... 580 mils (0.127 mm)
Resin Flow ... 8%.
Uniformly translucent over entire area.
Dielectric constant at 100 KHz ... 4.6.
Blister resistance ... 66.6%.

We claim:

1. In a laminate having a Tg of at least about 150° C. prepared from a cured composition comprising
   (A) at least one reinforcing material;
   (B) at least one epoxy resin; and
   (C) at least one curing agent for component (B);
   the improvement which comprises employing as at least a part of component (B) at least one hydrocarbon-phenol epoxy resin, halogenated hydrocarbon-phenol epoxy resin or combination thereof in an amount such that at least about 40 percent of the epoxy groups present in component (B) are contributed by said hydrocarbonphenol epoxy resin or halogenated hydrocarbon-phenol epoxy resin.

2. A laminate of claim 1 wherein
   (i) component (A) is fiberglass or an aromatic polyamide;
   (ii) component (B) is (1) a hydrocarbon-phenol epoxy resin, (2) a halogenated hydrocarbon phenol epoxy resin, (3) a combination of a hydrocarbon-phenol epoxy resin and a halogenated hydrocarbon-phenol epoxy resin, (4) a combination of (a) a hydrocarbonphenol epoxy resin or a halogenated hydrocarbon-phenol epoxy resin or combination thereof and (b) a phenolaldehyde epoxy novolac resin, a halogenated phenol-aldehyde epoxy novolac resin, a bisphenol A based epoxy resin, a halogenated bisphenol A based epoxy resin or any combination thereof;
   (iii) component (C) is an amine, a biguanide or a phenolic material; and
   (iv) said hydrocarbon-phenol epoxy resin or halogenated hydrocarbon-phenol epoxy resin is present in an amount such that from about 90 to about 100 percent of the epoxy groups present in component (B) are contributed by said hydrocarbon-phenol epoxy resin or halogenated hydrocarbonphenol epoxy resin or combination thereof.

3. A laminate of claim 2 wherein
   (i) component (B) is the product resulting from dehydrohalogenating the reaction product of an epihalohydrin and the product resulting from reacting phenol, cresol or a combination thereof with (a) an unsaturated hydrocarbon containing an average of from 6 to about 55 carbon atoms per molecule or halogenated derivatives of such reaction products, or mixture of such hydrocarbons or halogenated derivatives thereof; (b) oligomers and/or cooligomers of hydrocarbon dienes, which dienes have from 4 to about 18 carbon atoms or mixture of such hydrocarbons or halogenated derivatives thereof or (c) a combination of (a) and (b); and
   (ii) component (C) is dicyandiamide, diaminodiphenylsulfone a phenol-formaldehyde resin, a hydrocarbon-phenol resin, or a combination thereof.

4. A laminate of claim 2 wherein
   (a) component (B) is
      (i) the product resulting from dehydrohalogenating the reaction product of an epihalohydrin and the product resulting from reacting phenol, cresol or a combination thereof with a composition comprising from about 70 to about 100 percent by weight of dicyclopentadiene, from about zero to about 30 percent by weight of $C_{10}$ dimers, from about zero to about 7 percent by weight of oligomers of $C_4$-$C_6$ unsaturated hydrocarbons and the balance if any to provide 100% by weight of $C_4$-$C_6$ alkanes, alkenes or dienes;
      (ii) halogenated derivatives of the product of component (i); or
      (iii) combinations thereof; and
   (b) component (C) is dicyandiamide, diaminodiphenylsulfone, a phenolformaldehyde novolac resin, a hydrocarbonphenol resin, or a combination thereof.

5. A laminate of claim 1 which is an electrical laminate.

6. An electrical laminate of claim 5 which is a printed circuit board.

7. A laminate of claim 2 which is an electrical laminate.

8. An electrical laminate of claim 7 which is a printed circuit board.

9. A laminate of claim 3 which is an electrical laminate.

10. An electrical laminate of claim 9 which is a printed circuit board.

11. A laminate of claim 4 which is an electrical laminate.

12. An electrical laminate of claim 11 which is a printed circuit board.

* * * * *